United States Patent [19]

Yamamoto et al.

[11] Patent Number: 4,853,636
[45] Date of Patent: Aug. 1, 1989

[54] NMR IMAGING METHOD

[75] Inventors: Etsuji Yamamoto, Akishima; Yukiko Ogura, Hachioji; Hideki Kohno, Tokyo, all of Japan

[73] Assignee: Hitachi, Ltd., Tokyo, Japan

[21] Appl. No.: 141,788

[22] Filed: Jan. 11, 1988

[30] Foreign Application Priority Data

Jan. 12, 1987 [JP] Japan .................................. 62-3183
Feb. 4, 1987 [JP] Japan .................................. 62-22313

[51] Int. Cl.$^4$ .......................................... G01R 33/20
[52] U.S. Cl. ........................................ 324/309; 324/312
[58] Field of Search ............... 324/309, 307, 310, 312; 128/653

[56] References Cited

U.S. PATENT DOCUMENTS 4,599,565  7/1986  Hoenninger, III et al. ......... 324/309
4,607,222  8/1986  Yokoyama et al. ................. 324/309
4,644,278  2/1987  Sano et al. .......................... 324/309

Primary Examiner—Stewart J. Levy
Assistant Examiner—Louis M. Arana
Attorney, Agent, or Firm—Antonelli, Terry and Wands

[57] ABSTRACT

An NMR imaging method for obtaining a tomographic image of an object through two-dimensional Fourier transformation imaging. After a whole image of a predetermined slice is displayed, a given field of view having a given size and located at a given position in the image is designated. On the basis of data derived from this designation, setting values for magnetic field generators and a signal detector are arithmetically determined for limiting the region in which the NMR signal is generated and the region to be imaged, whereby local imaging of the aforementioned field of view is conducted with high resolution. Further, division of an image resulting from the imaging operation is automatically corrected by exchanging positionally the divided image blocks with each other.

6 Claims, 12 Drawing Sheets

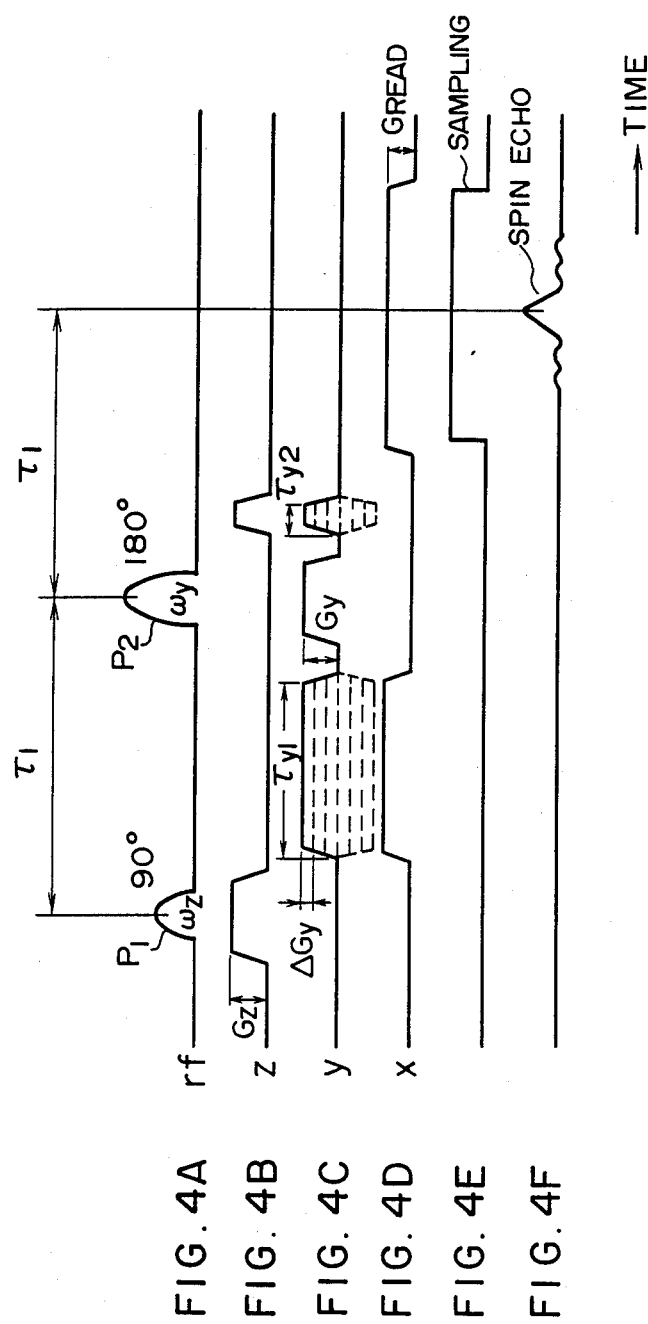

NMR IMAGING METHOD

BACKGROUND OF THE INVENTION

The present invention relates generally to an imaging method and apparatus in which phenomenon of the nuclear magnetic resonance (hereinafter referred to as NMR in abbreviation) is made use of and more particularly to an imaging method and apparatus capable of moving a part or region of the image of an object under inspection in a phase encoding direction.

Heretofore, X-ray computed tomography (CT) apparatus and ultrasonic imaging method and apparatus are extensively used as the means for inspecting or observing nondestructively internal structures of the head, abdominal region and others of the human body. Recently, attempts of conducting the similar inspection by making use of the NMR phenomenon have achieved success, and it has turned out that information or data which could not be obtained with the X-ray CT or ultrasonic imaging method and apparatus are made available. In the inspecting apparatus operative based on the NMR phenomenon, it is required to separate and identify discriminatively the signals produced by the object under inspection in correspondence with individual parts of the object. As one of the means for realizing this function, there is known a method according to which a gradient magnetic field is applied to thereby differentiate the static magnetic fields under which the individual regions or parts of the object are placed and hence the resonance frequencies or phase encoded quantities of the individual parts to thereby obtain the positional information. The basic principle of the NMR imaging is reported in "J. Magn. Reson." Vol. 18, p. 69 (1975) and "Phys. Med. & Biol.", Vol. 25, p. 751 (1980).

As one of the imaging methods of this sort, there can be mentioned a locally selective excitation imaging method according to which a specified region or part of the human body is selectively excited to allow only that part to be imaged. In this locally selective excitation imaging, the field of view to be imaged is required to be moved. In this conjunction, a method of moving the field of view is disclosed, for example, in Japanese Patent Application Laid-Open No. 207045/1985 (JP-A-No. 60-207045). According to this method, a phase modulation and a frequency modulation is performed on the NMR signal along two orthogonal axes, respectively, in a selectively excited plane, and the orientation of the two axes is selected in dependence on the position of the field of view to be imaged so that the center position of coil coincides with the axis for the frequency modulation independent of the position of the field of view to be imaged. This method is however disadvantageous in that the orientation of the image itself varies in dependence on the position of the field of view to be imaged, not to speak of high technical expenditure involved in changing the direction of the gradient magnetic field in accordance with the position of the field of view to be imaged.

SUMMARY OF THE INVENTION

An object of the present invention is to provide an NMR imaging method and apparatus in which the orientation of the image can remain constant independent of the position of the field of view and in which the local imaging can be realized at low technical expenditure.

Another object of the present invention is to provide an NMR imaging method and apparatus in which divided images produced due to arbitrary setting of the position of the field of view to be imaged can be automatically restored to a normal image.

A still further object of the present invention is to provide an NMR imaging method and apparatus in which not only the position of the field of view but also the size thereof and thus the magnification factor can be set at respective desired values so that optimum image can be ensured constantly.

In view of the above objects, there is provided according to an aspect of the present invention an NMR imaging method and apparatus in which a whole tomographic image of concern is displayed on a display device, and a region of the image which is to be selected is designated, wherein the frequency of RF magnetic field, intensity of gradient field, the band of a filter, frequency of a reference signal for signal detection and the sampling rate are automatically calculated and set on the basis of the position and size of the region to be selected for the measurement. The region in which the NMR signal is generated can be limited to the region to be selected and made to coincide with the region to be imaged, whereby the local imaging can be accomplished.

According to another aspect of the present invention, there is proposed such an arrangement in which after reconstitution of an image through two-dimensional Fourier transformation of the NMR signal, a region of the image in which only noise is present is detected, wherein the image is divided by a line passing the abovementioned region perpendicularly to the phase encoding direction, and the positions of the divided images are exchanged with each other in an automatic manner.

BRIEF DESCRIPTION OF THE DRAWINGS

FIGS. 4A to 4F are views showing time charts for illustrating another sequence of measurements which can be carried out with the apparatus shown in FIG. 1;

DESCRIPTION OF THE PREFERRED EMBODIMENTS

Figure 1:
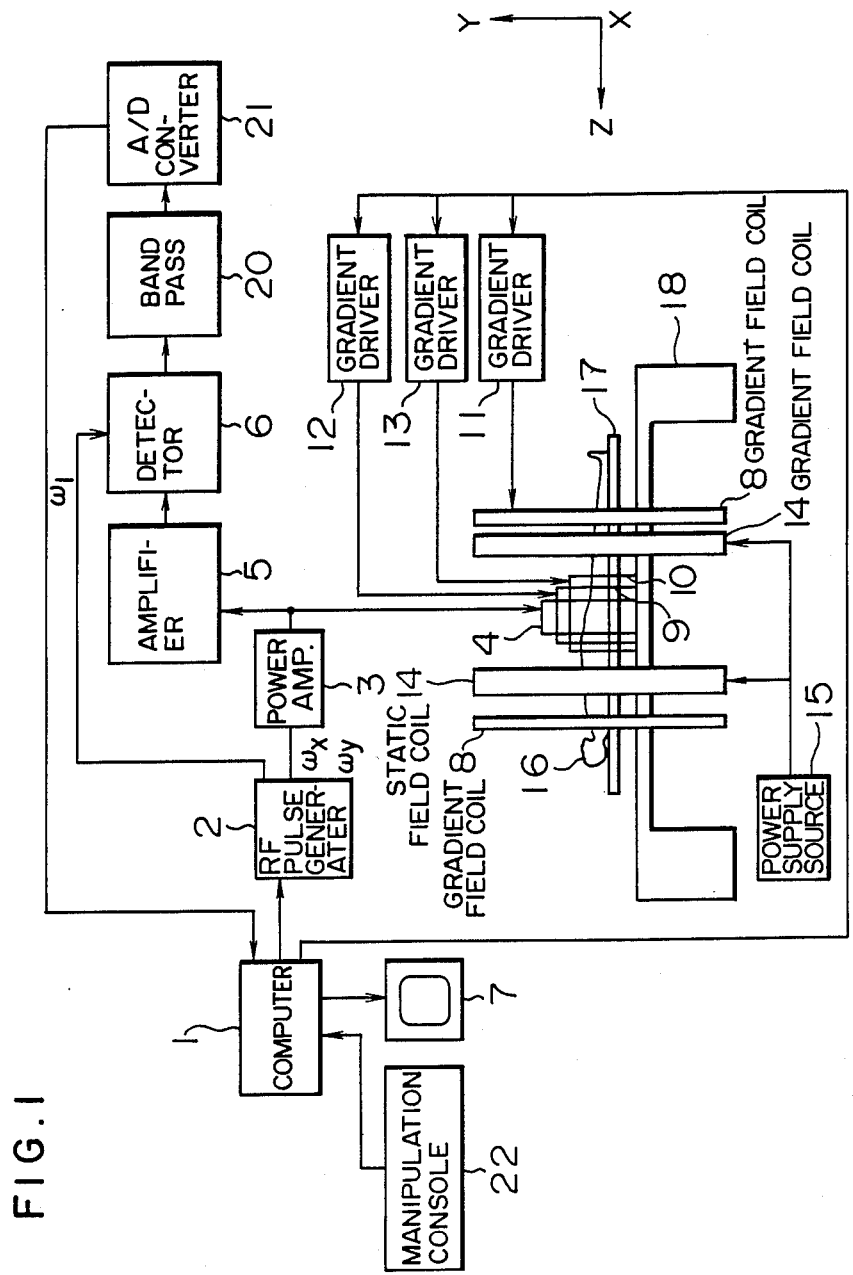
FIG. 1 is a block diagram showing an arrangement of the NMR imaging method and apparatus according to an embodiment of the present invention.

FIG. 1 shows schematically a general arrangement of an NMR imaging method and apparatus according to an exemplary embodiment of the present invention. Referring to the figure, a static magnetic field coil 14 is so arranged that upon energization thereof by a power supply source 15, the effective field area of view positioned internally of the coil 14 is placed under a static magnetic field of a predetermined direction (Z-direction) and a predetermined intensity ($H_o$). A gradient coil 8 of the Z-direction is constituted by a pair of coils through which electric currents flow in the opposite directions, respectively. Upon energization of a gradient field coil 8 by a gradient driver circuit 11, a gradient makes appearance in the intensity distribution of the magnetic field along the Z-direction. Similarly, the gradient field coils 9 and 10 are driven by respective gradient drivers 12 and 13, whereby the abovementioned intensity profile of the magnetic field exhibits gradients in the X- and Y-directions, respectively, with the origin of the X-, Y- and Z-coordinate system being located at the center of these coils. A human body 16 which is the object for inspection is disposed on a bed 17 which in turn is supported on a platform 18 so as to be movable thereon.

The output of a high frequency or RF pulse generator 2 is amplified by a power amplifier 3 for exciting a RF coil 4, which serves also a reception coil for receiving nuclear magnetic resonance signals (NMR signal) as produced. The signal components received by the RF coil 4 undergo phase-sensitive detection by a detector 6 after having been amplified by an amplifier 5. A reference signal for this detection is derived from the pulse generator 2. The detected signal is then subjected to a band limitation by a band-pass filter 20 and subsequently sampled by an analogue-to-digital (A/D) converter 21 to be subsequently fetched by a computer 1, which is programmed to perform processings such as Fourier transformation, image reconstitution and others, whereby a signal intensity distribution on a section of the human body is transformed into an image which is then displayed on a display device 7.

The computer 1 is imparted with a function to output various control commands to different components at predetermined timing in response to manipulations on a console 22.

In the NMR imaging method and apparatus according to the embodiment now under consideration, a whole image of a section under to be inspected is displayed on the display device 7. When a region to be selected out from the entire image is designated from the console 22, values of the intensities of individual ingredient magnetic fields, the band pass width of the filter 20, the sampling frequency of the A/D converter 21 and the oscillation frequency of the RF generator 2 are arithmetically determined automatically by the computer 1, whereby the various components mentioned above are controlled in accordance with the relevant determined values.

Figure 2:
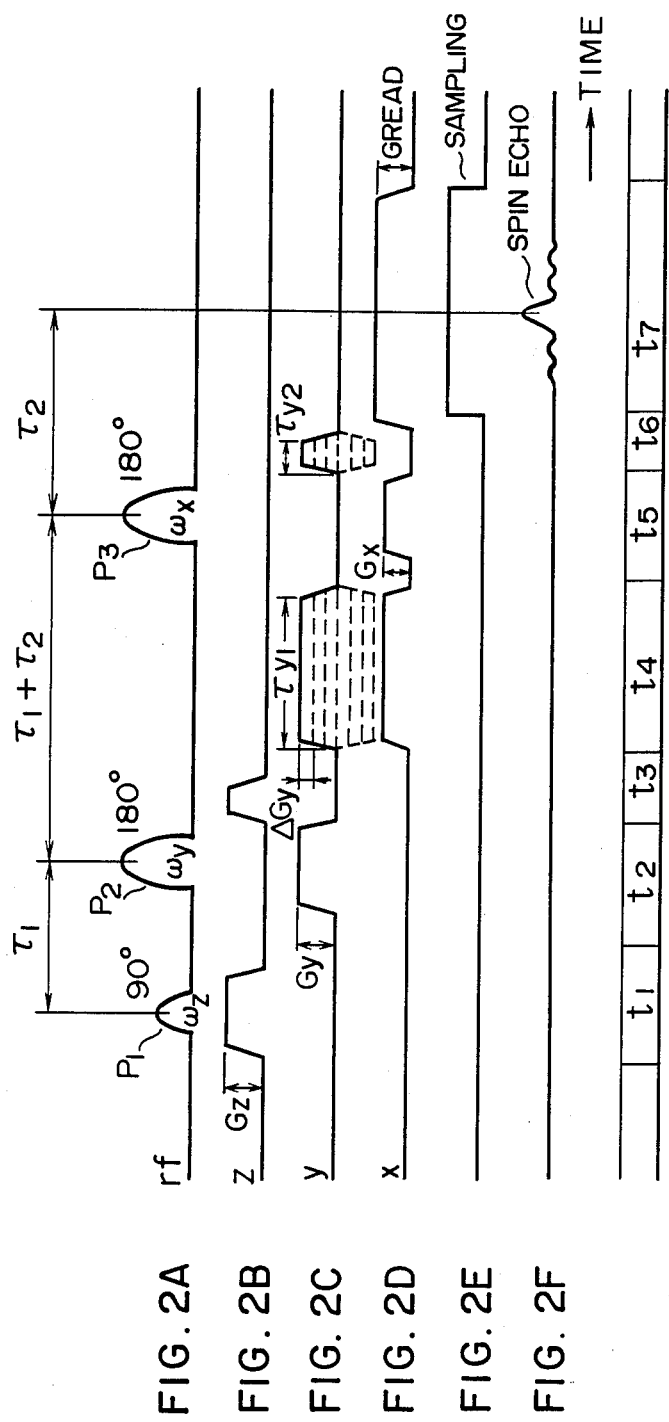
FIGS. 2A to 2F are views showing time charts for illustrating, by way of example, a sequence of measurement process which can be carried out with the NMR imaging method and apparatus shown in FIG. 1.

FIGS. 2A to 2F show a pulse sequence for realizing the local high-resolution imaging, in which FIG. 2A shows a RF magnetic field pulse train, FIG. 2B shows a Z-gradient magnetic field pulse train produced by the gradient field coil 8, FIG. 2C shows a Y-gradient magnetic field pulse train generated by the gradient coil 10, FIG. 2D shows a X-gradient magnetic field pulse train produced by the gradient coil 9, FIG. 2E shows period in which the sampling is performed by the A/D converter 21, and FIG. 2F shows an NMR signal to be sampled.

In a period $t_1$, 90° −RF magnetic field pulse $P_1$ is applied under application of the Z-gradient magnetic field, whereby spins in a slice orthogonal to the Z-direction are selectively excited. The value of center angular frequency $\omega_z$ of the magnetic field pulse $P_1$ determines the position of a section to be imaged in the Z-direction. In a succeeding period $t_2$, 180° −RF magnetic field pulse $P_2$ having a center angular frequency $\omega_y$ and an angular frequency band width $\Delta\omega_y$ is applied under the application of the Y-gradient magnetic field of the intensity $G_y$, whereby direction only of the spins in a certain region in the Y-direction is inverted. The time span between the peaks of the pulses $P_1$ and $P_2$ is represented by $\tau_1$. The Z-gradient magnetic field applied in a period $t_3$ is to compensate the phase dispersion due to the application of the gradient magnetic field in the period $t_1$. In a period $t_4$, Y- and X-gradient magnetic fields are applied. The former serves as the gradient magnetic field for encoding the positional information in the Y-direction in terms of the phase of spin (and referred to as phase encoding gradient magnetic field), while the latter serves as a dephasing magnetic field which cancels out the effect of the X-gradient magnetic field applied during a preceding half of a period $t_7$ for thereby causing echo to make appearance at a predetermined time point. In a period $t_{t6}$, the Y-gradient magnetic field is again applied for the purpose of cancelling the influence exerted on the phase encoded quantity due to transients of rise-up and fall of the magnetic field. In a period $t_5$, 180° −RF magnetic field $P_3$ having a center angular frequency $\omega_x$ and an angular frequency band width $\Delta\omega_x$ is applied in addition to the X-gradient magnetic field of the intensity $G_x$, whereby direction only of the spins in a certain region located along the X-direction are inverted. Through the process described above, only the spins occurring in a definite rectangular region of the predetermined slice or section can form echo signals having respective peaks at a time point distanced from the peak of the 180° −RF magnetic field pulse by a time span $\tau_2$. The echo signals can be read out in a period $t_7$ by way of the detector 6 and the A/D converter 20 in the state in which a X-gradient magnetic field of intensity $G_{READ}$ (referred to as the reading-out gradient magnetic field) is applied.

The process or sequence described above is repeated a plurality of times by changing intensity of the phase encoding gradient magnetic field by $\Delta G_y$ in the periods $t_4$ and $t_6$ upon every repetition, as indicated by broken lines in FIG. 2C. The change $\Delta G_p$ in the phase encode quantity is given by $$\Delta G_p \approx \Delta G_y (\tau_{y1} - \tau_{y2}) \qquad (1)$$

Through the repetition, there can be obtained the data required for the two-dimentional Fourier transformation imaging.

Figure 3:
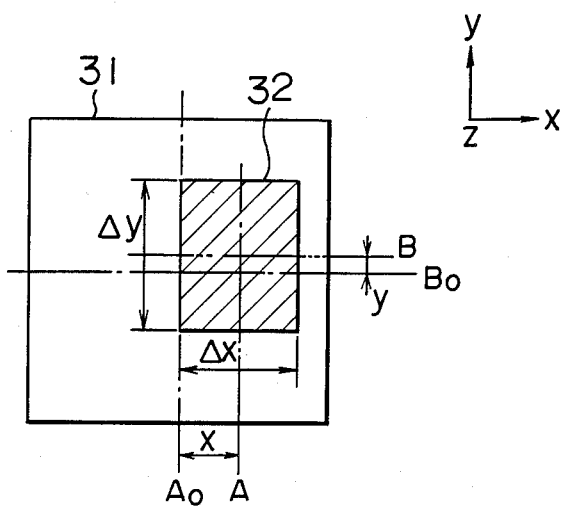
FIG. 3 is a schematic diagram for illustrating relation between a whole field of view and a local field of view to be selected therefrom.

In the case of the illustrative embodiment of the present invention, image of an entire field of view denoted by a reference numeral 31 in FIG. 3 is first displayed on the display device 7 and subsequently a local field of view 32 to be imaged with an increased resolution power is designated on the display screen. Then, various parameters for the sequence illustrated in FIGS. 2A to 2F are automatically determined by the computer 1 so that the echo signals can be obtained only from the spins in the region corresponding to the local field of view 32. More specifically, parameters $G_x$, $G_y$, $\omega_x$, $\omega_y$, $\Delta\omega_x$, $\Delta\omega_y$ and x, y, $\Delta x$, $\Delta y$ are so determined that the following relations apply valid:

$$G_x = \Delta\omega_x/\gamma\Delta x \quad (2)$$

$$G_y = \Delta\omega_y/\gamma\Delta y \quad (3)$$

$$\omega_x = -\gamma(H_o + G_x \cdot x) \quad (4)$$

$$\omega_y = -\gamma(H_o + G_y \cdot y) \quad (5)$$

where $\Delta x$ and $\Delta y$ represent the widths of the field 32 to be locally imaged in the X- and Y-directions, respectively, x and y represent the coordinates of the center of the field of view 32 with respect to the origin defined by the center of the entire field 31 (i.e. the center of the respective coils), $H_o$ represents the static field intensity and $\gamma$ represents the ratio of magnetic rotation.

When the sequence illustrated in FIGS. 2A to 2F is executed on the basis of the parameters set as mentioned above, there are produced echo signal reflecting the signal components originating only in the spins within the region corresponding to the field of view 32. In other words, the selective excitation can be accomplished in which the range to be excited is limited to the region which corresponds to the field of view 32. Parenthetically, it should be mentioned that the region to be selected in the X-direction can be limited by limiting the band pass width of the filter 20 shown in FIG. 1 instead of limitation effectuated by the RF pulse $P_3$. The sequence for executing this limitation of the region to be selected in the X-direction is illustrated in FIGS. 4A to 4F. This sequence differs from that illustrated in FIGS. 2A to 2F in that the sampling is performed under application of the gradient megnetic field $G_{READ}$ for reading out the spin echoes produced in response to the RF pulse $P_2$ and that the phase encoding Y-gradient magnetic field is applied in precedence to the application of the RF pulse $P_2$ for the purpose of reducing the time required for the imaging sequence. Setting of the center angular frequency $\omega_y$ of the RF pulse $P_2$, the angular frequency band width $\Delta\omega_y$ and the Y-gradient magnetic field intensity $G_y$ is made in the utterly the same manner as described hereinbefore in conjunction with the expressions (3) and (5). Additionally, the cut-off frequency $\omega_c$ of the filter 20 is set as follows on the assumption that the signal detection is performed based on the quadrature detection.

$$\omega_c = 2\gamma \cdot G_{READ} \cdot \Delta x \quad (6)$$

In correspondence with limitation of the range for the selective excitation, that is, the range in which the spin signals are to be measured, the range in which image is to be reconstituted must be made to coincide with the field of view 32 shown in FIG. 3.

For moving the center of the field for the image reconstitution by a distance x in the X-direction, the angular frequency $\omega_1$ of the reference signal for the detector 6 is selected to meet the following equation:

$$\omega_1 = \gamma(H_o + G_{READ} \cdot x) \quad (7)$$

For setting the width of the field of view in the X-direction equal to $\Delta x$, the sampling period T in the sampling interval shown in FIGS. 2F or FIG. 4E is set as follows:

$$T = 2\pi/\gamma \cdot G_{READ} \cdot \Delta x \quad (8)$$

Alternatively, when the sampling period T is fixed, the reading-out gradient field $G_{READ}$ is set to satisfy the following condition:

$$G_{READ} = 2\pi/\gamma \cdot T \cdot \Delta x \quad (9)$$

Figure 5:
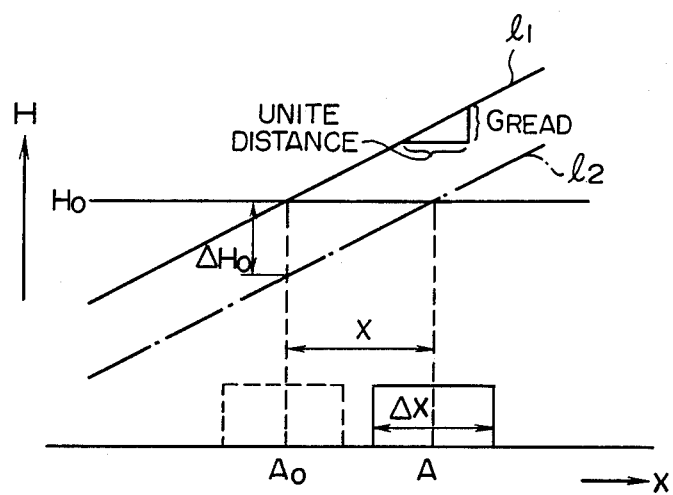
FIG. 5 is a view showing a schematic diagram for illustrating the effect due to change in the intensity of the static magnetic field.

As an another method of obtaining the same effect as described in conjunction with the expression (7), the angular frequency of the reference signal can be set constant at $\omega_o$ while only the period for sampling the static field intensity is changed by $\Delta H_o$. This method will be elucidated by referring to FIG. 5. When a gradient magnetic field of the intensity equal to that of the field $G_{READ}$ is applied, distribution of the field intensity along the X-direction is such as illustrated by a solid line $l_1$ in FIG. 5. The nuclear magnetic resonance (NMR) angular frequency $\omega_o$ at the center $A_o$ of the coil is given by $\omega_o = \gamma \cdot H_o$. On the other hand, when the static field intensity is changed by a value given by $$\Delta H_o = -G_{READ} \cdot x \quad (10)$$

then, distribution of the static field intensity in the X-direction is such as depicted by a single-dotted broken line $l_2$. As will be seen therefrom, the position corresponding to the NMR angular frequency $\omega_o$ is moved by the distance x toward the position A. In this way, the center of the field of view can also be moved by the distance x by changing the static magnetic field intensity by $\Delta H_o$ in accordance with the expression (10).

Figure 6:
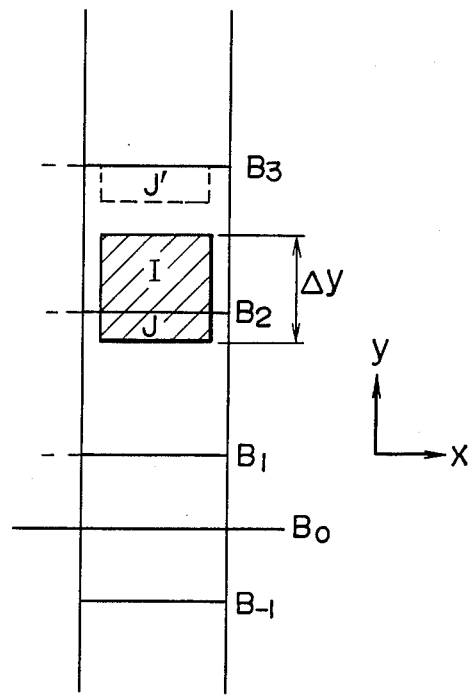
FIG. 6 and FIGS. 7A and 7B are views showing schematic diagrams for illustrating division of an image and mutual exchange of image blocks resulting from the image division.

In the Y-direction (i.e. phase encoding direction), the field of the view at an arbitrary position can be imaged by conducting the aforementioned selective excitation in the Y-direction by making use of the folding phenomenon, which will be elucidated by referring to FIG. 6. It is assumed that the region to be imaged which is determined by the value of change $\Delta G_p$ of the phase encode quantity given by the expression (1) extends from $B_{-1}$ to $B_1$, as shown in FIG. 6. When excitation is effected in a wide range instead of the selective excitation in the Y-direction, the image obtained through the two-dimensional Fourier transformation includes not only the spin distribution in the range from $B_{-1}$ to $B_1$ but also the spin distribution in the range from $B_1$ to $B_2$ or from $B_2$ to $B_3$ folded over the spin distribution in the range from $B_{-1}$ to $B_1$, by way of example. Accordingly, when the range in which the spin signals are produced by the selective excitation is limited to the hatched region shown in FIG. 6, the image in this hatched region can be reconstituted through the two-dimensional Fourier transformation. In that case, however, the following relation must apply valid between the change $\Delta G_p$ of the phase encoding quantity and the width $\Delta y$ of the selective excitation in the Y-direction. That is, $$\Delta G_p = 2\pi/\gamma \cdot \Delta Y \quad (11)$$

Figure 7A:
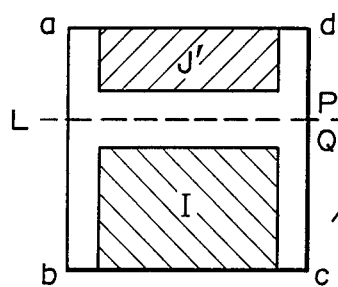
Figure 7B:
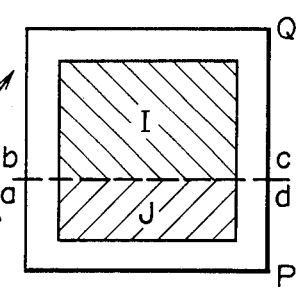

As will be seen from the above description, when the field of view to be imaged is designated as indicated by reference numeral 32, the computer 1 determines those parameters $\omega_y$, $\Delta\omega_y$, $G_y$, $\omega_x$, $\Delta\omega_x$ and $G_x$ (or $\omega_y$, $\Delta\omega_y$, $G_y$ and cut-off angular frequency $\omega_c$ of the filter 20) which define the range to be selectively excited, and additionally determines those parameters $\omega_1$ (or $\Delta H_o$), T (or $G_{READ}$) and $\Delta G_p$ which define the region to be imaged. By using these parameters, measurement is carried out, whereupon Fourier transformation of the collected data is performed by the computer 1, which results in generation of the local image of the field of view 32 with high resolution. It should however be noted that the object image, for example, in the hatched region shown in FIG. 6 is divided into a part I and a part J', whereby these image parts are displayed in the vertically upset state, as indicated by I and J' in FIG. 7A. Accordingly, it is required to divide the image data into two data blocks by a line L shown in FIG. 7A and exchange the positions of these image data blocks to thereby obtain the normal image shown in FIG. 7B. For determining the position of the dividing line L, there are conceivable various methods mentioned below.

Representing the distance between $B_o$ and the center of the selectively excited region (hatched region) by y, as shown in FIG. 6, the turned-back image dividing line extends from $B_3$ to $y - nB$ (n is an integer). By dividing the image by this line and exchanging the positions of the image portions resulting from the division, there can be obtained a normal image.

Figure 8:
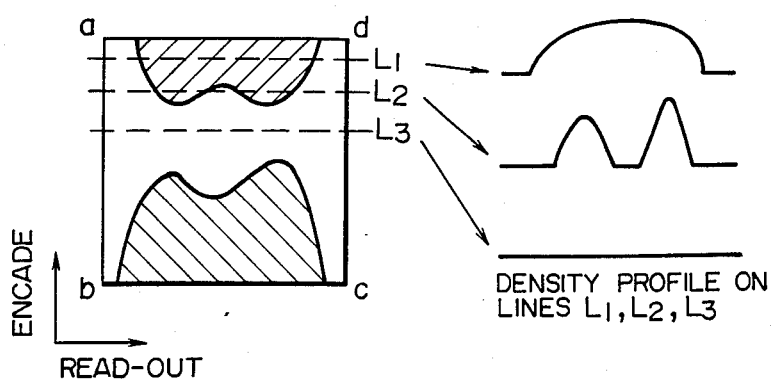
FIGS. 8 to 11 are views showing schematic diagrams for illustrating procedures of exchanging the image blocks.

FIG. 8 is a view for illustrating an exemplary one of the methods. In this figure, a hatched area represents an image of a desired body portion produced in the set field of view, from which it will be seen that the image is divided into parts I and J'. In the first place, a density profile on a given line $L_1$ of the direction (X-direction) perpendicular to the encoding direction is determined. Unless the density profile is at noise level and flat, the density profile on other lines are determined repeatedly. When the density profile on a line $L_3$ is found to be at noise level and flat, this line $L_3$ is used as the division line L shown in FIG. 7A.

Figure 9:
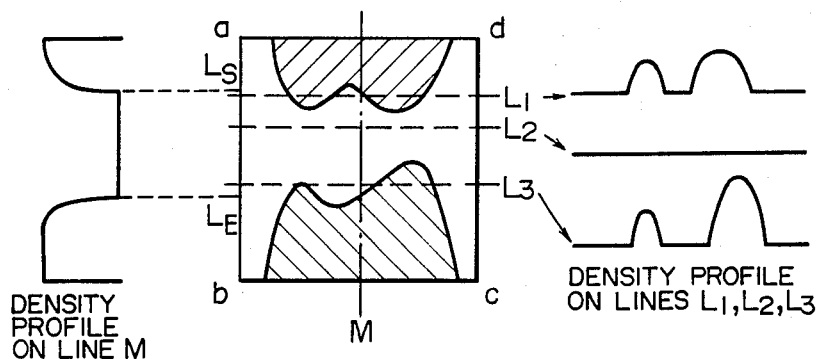

FIG. 9 illustrates another method of determining the image dividing line. In the first place, the density profile on a given line M of the direction (Y-direction) parallel to the encoding direction is determined to detect regions $L_S - L_E$ of noise level. Subsequently, density profile is determined on and along a line $L_1$ extending between the regions $L_S - L_E$ perpendicularly to the encoding direction. In case the density profile on the line $L_1$ is neither at noise level nor flat, the density profile on other lines is determined as with the case illustrated in FIG. 8. When a line on which the density profile is at noise level and flat as in the case of the line $L_2$ is found, this line is selected as the dividing line L shown in FIG. 7A.

Figure 10:
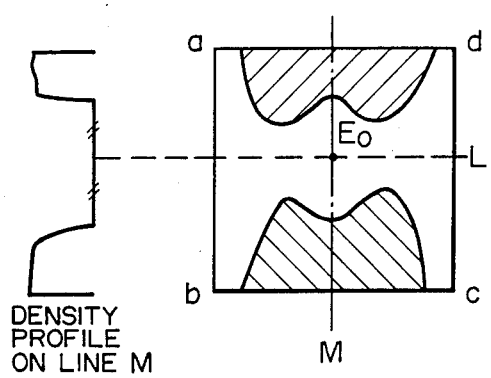

FIG. 10 shows still another exemplary method of determining the image dividing line. First, the density profile is determined on and along a line M of the direction (Y-direction) parallel to the encoding direction. Subsequently, a mid-point $E_o$ of the region where the density profile is at noise level is determined, wherein the line L passing the mid-point $E_o$ in the direction (X-direction) perpendicular to the encoding direction is selected as the dividing line.

Figure 11:
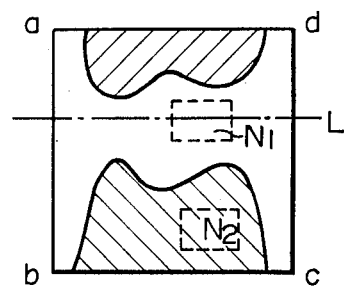

FIG. 11 shows still another method of determining the image dividing line. According to this method, an average density of a predetermined region occupying a give position in the image is first determined. Unless the average density value is at noise level as in the case of the region $N_2$, the average density value is determined for another region. This procedure is repeated. When a region is detected in which the average density value is at noise level as represented by a region $N_1$ is found, a given line L passing the region $N_1$ in the direction perpendicularly to the encoding direction is selected as the dividing line.

Figure 12:
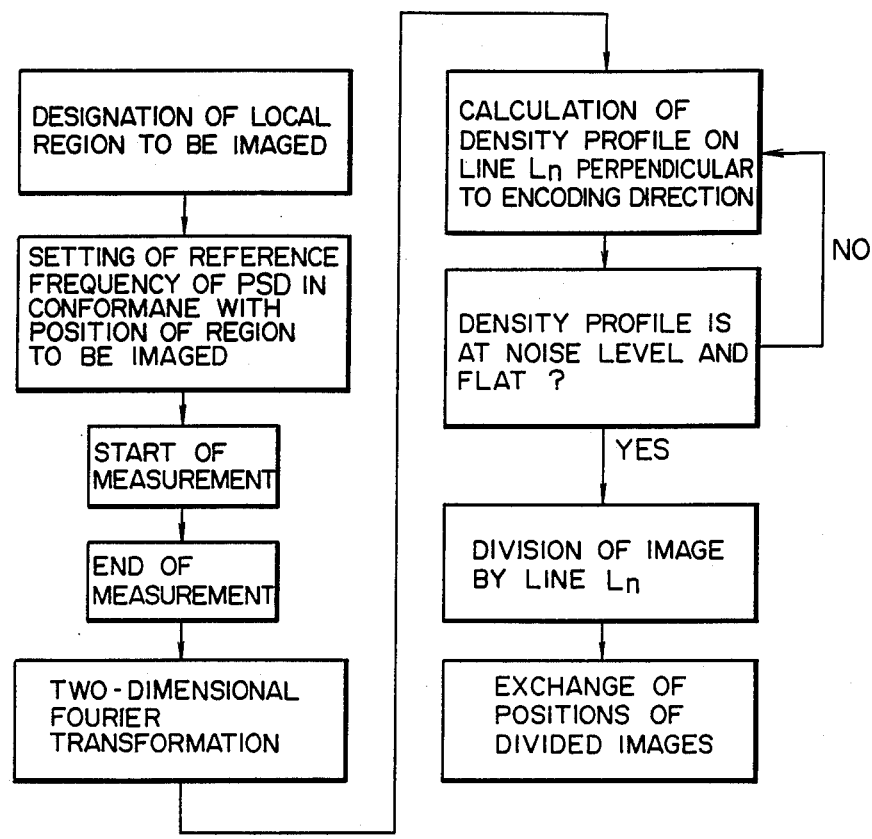
FIGS. 12 to 15 are views showing flow charts corresponding to FIGS. 8 to 11, respectively.
Figure 13:
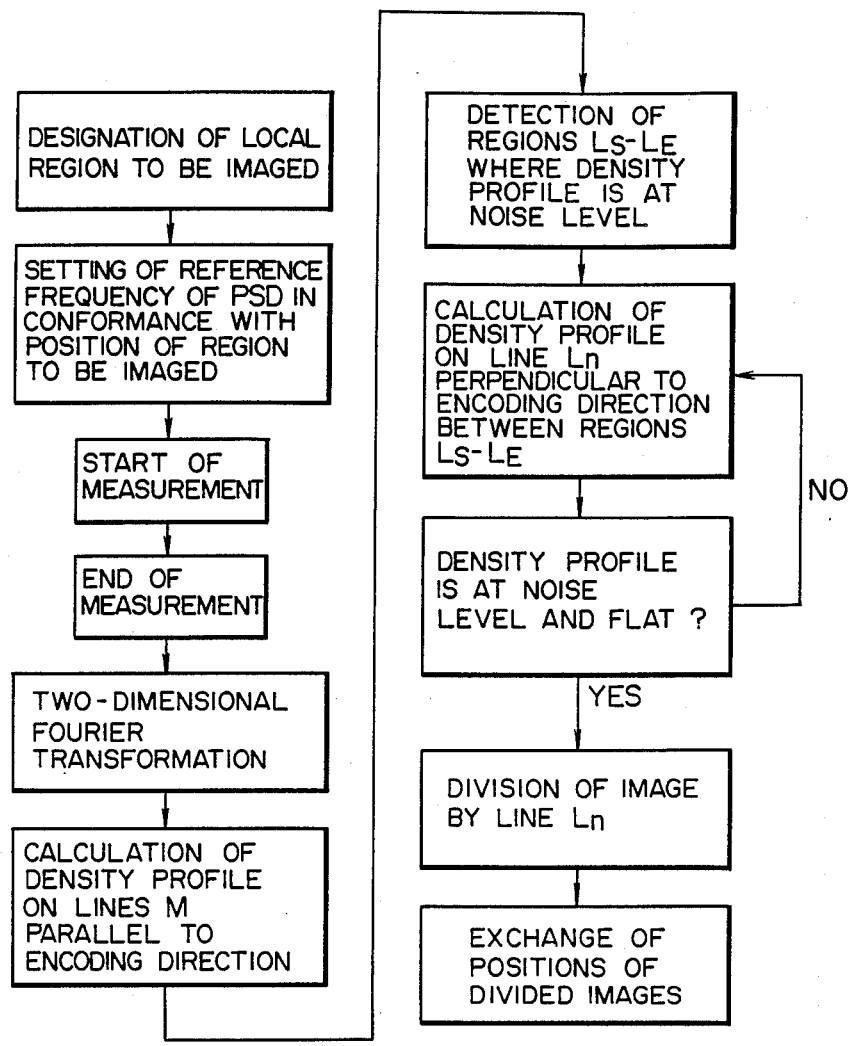
Figure 14:
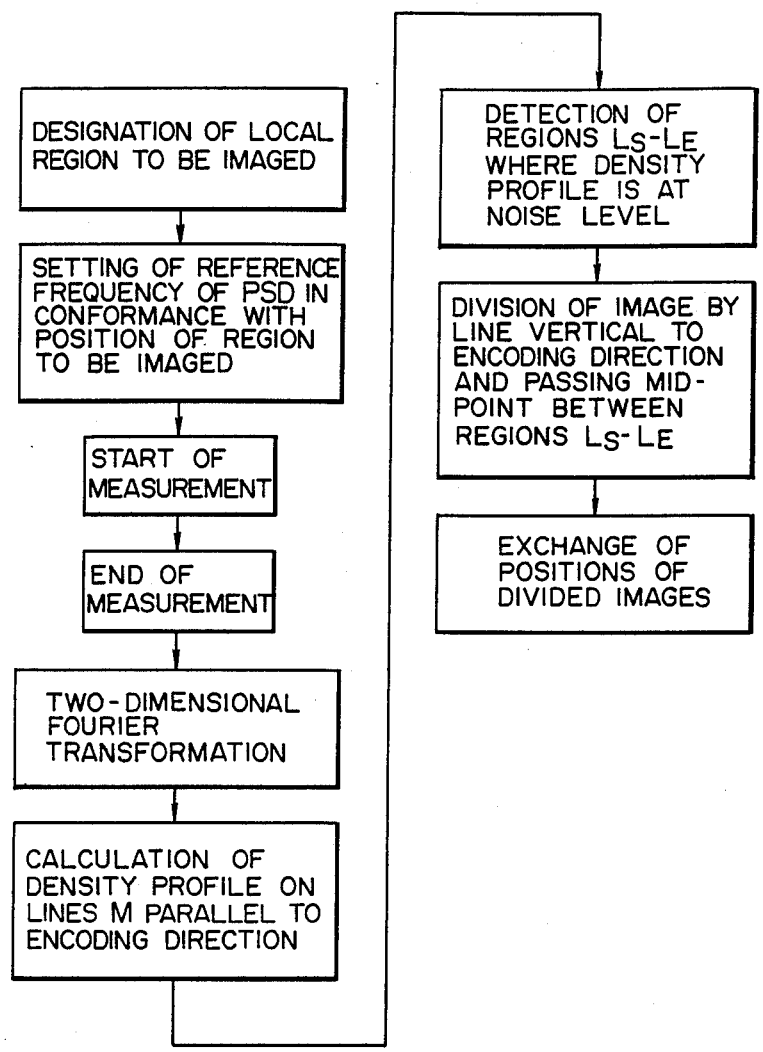
Figure 15:
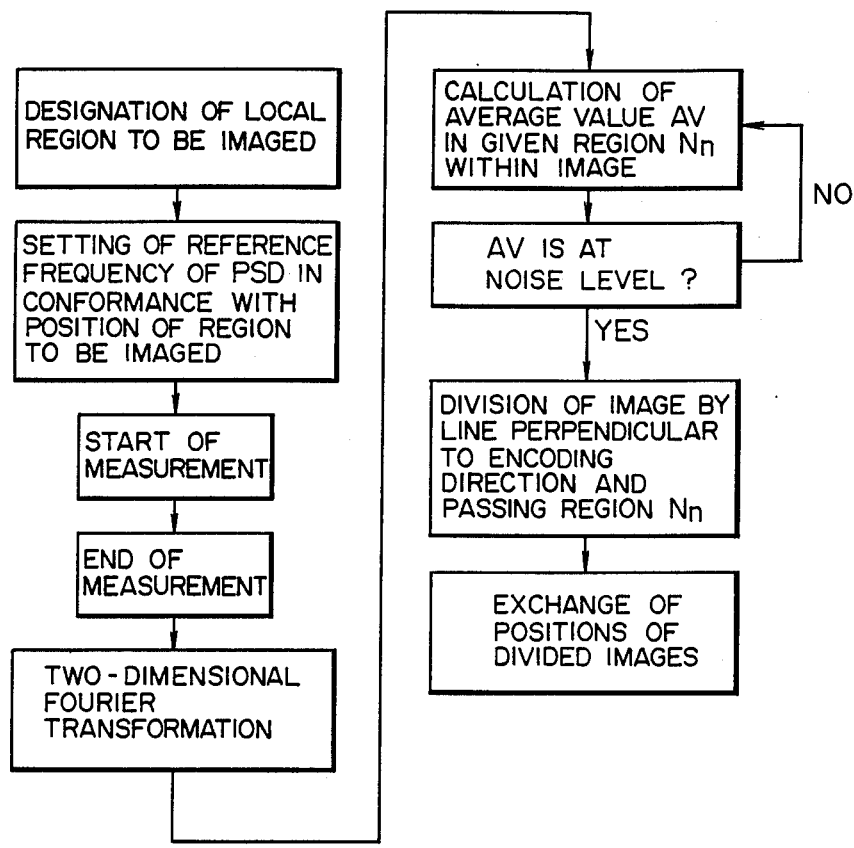

FIG. 12 shows a flow chart for illustrating the procedure described above in conjunction with FIG. 8. FIG. 13 illustrates in a flow chart the procedure described above by reference to FIG. 9. FIG. 14 illustrates in a flow chart the procedure described by reference to FIG. 10. And FIG. 15 is a flow chart for illustrating the procedure described by reference to FIG. 11.

Figure 16:
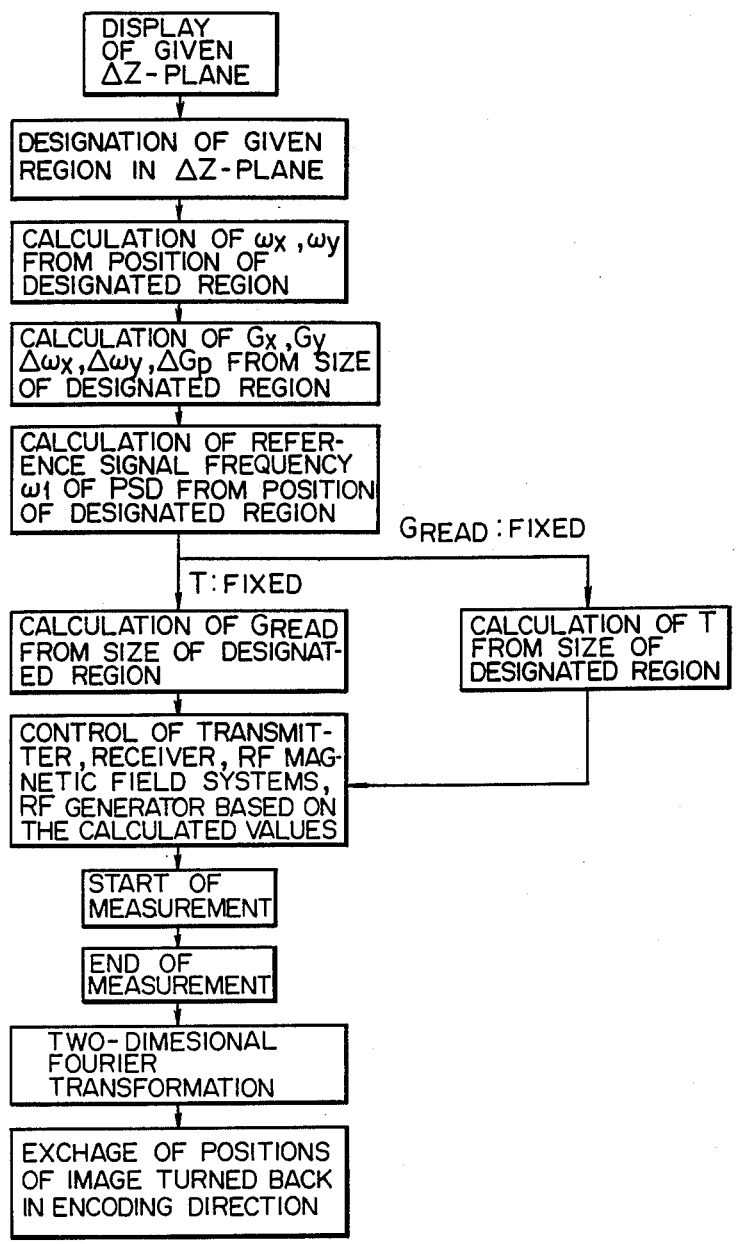
FIGS. 16 and 17 are views showing flow charts for illustrating, respectively, operations of the NMR imaging method and apparatus according to embodiments of the invention.
Figure 17:
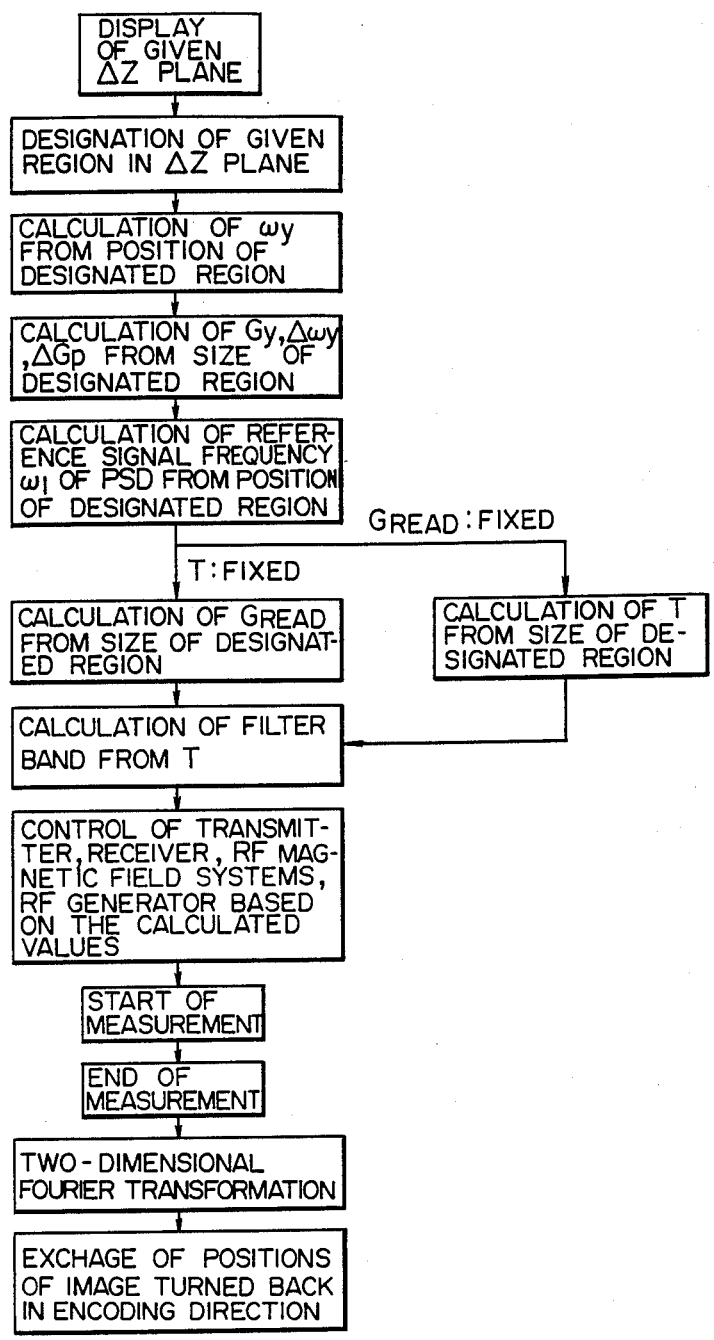

Finally, FIG. 16 shows a flow chart for illustrating the whole sequence of operations according to an embodiment of the present invention, in which the measurement sequence described hereinbefore in conjunction with FIGS. 2A to 2F is adopted. On the other hand, FIG. 17 illustrates in a flow chart the procedure in which the sequence of measurement described hereinbefore by reference to FIGS. 4A to 4F is adopted. In either of these procedures, the operation for exchanging the image positions at the final step can be realized in accordance with any one of the methods shown in FIGS. 12, 13, 14 and 15.

In the foregoing description, it has been assumed that the present invention is applied to the apparatus in which the region for signal detection is limited by the selective excitation or with the aid of a filter, it should be understood that the invention can be equally applied to the apparatus where a coil such as a surface coil by which the signal detection region is spontaneously limited is employed.

We claim:

1. A nuclear magnetic resonance imaging method for obtaining images of a slice of a body placed in an inspection zone to which a static magnetic field is applied, by using a system providing two-dimensional Fourier imaging which includes steps (i) to (v) of:
   (i) exciting nuclear spins in said slice,
   (ii) applying a phase encoding gradient magnetic field along a first direction,
   (iii) obtaining data of an echo of said excited spins generated during existence of a reading gradient magnetic field along a second direction by phase sensitive detection on a signal of said echo using a reference signal, filtering of the detected signal, and discrete sampling of the filtered signal,
   (iv) repeating said steps (i) to (ii) while changing a time-intensity product of said phase encoding gradient magnetic field in a stepwise manner, and
   (v) reconstructing an image from data obtained through repetition of said steps, said imaging method further comprising steps of;
   (a) designating the size and positions along said first and second directions of a local region to be precisely inspected within said inspection zone;
   (b) calculating machine parameters of said system so that said echo reflects nuclear spins only in said local region, the change amount of the time-intensity product of said phase encoding gradient magnetic field corresponding to the width of said local region along said first direction and the frequency of said reference signal corresponding to the position of said local region along said second direction;
   (c) effecting said two-dimensional Fourier iamging by said system with the calculated machine parameters; and
   (d) completing a cross-sectional image of said local region by separating an image, which is obtained at said step (c), by a separating line along said second direction to obtain separated images and, by exchanging the positions of the separated images.

2. A nuclear magnetic resonance imaging method according to claim 1, further comprising a step of displaying an image of said slice covering the whole of said inspection zone, said size and positions of said local region being designated on said displayed image.

3. A nuclear magnetic resonance imaging method according to claim 1, wherein said image separating line is determined by detecting a line along said second direction and having a flat density profile at a noise level.

4. A nuclear magnetic resonance imaging method according to claim 1, wherein said step (d) includes sub-steps of:
calculating a density profile of a first line along said first direction on said image obtained at said step (c),
detecting a limited region on said first line where the density profile is at a noise level,
determining said image separating line by finding a line crossing said limited region along said second direction and having a flat density profile at the noise level.

5. A nuclear magnetic resonance imaging method according to claim 1, wherein said step (d) includes sub-steps of:
finding a limited region of a determined space on said image obtained at said step (c) having an average density value at a noise level; and
determining said image separating line which crossing said limited region along said second direction.

6. A nuclear magnetic resonance imaging method according to claim 1, wherein said two-dimensional Fourier imaging includes a step of reversing the direction of said excited spins by a frequency limited 180° RF magnetic pulse applied during existence of a gradient magnetic field along said first direction to generate said echo and, wherein said machine parameters includes a frequency band of said 180° RF magnetic pulse and a cut-off frequency of filtering in said step (ii).

* * * * *